United States Patent
Gong et al.

(10) Patent No.: US 9,252,365 B2
(45) Date of Patent: Feb. 2, 2016

(54) P-TYPE TRANSITION METAL OXIDE-BASED FILMS SERVING AS HOLE TRANSPORT LAYERS IN ORGANIC OPTOELECTRONIC DEVICES

(71) Applicants: Xiong Gong, Hudson, OH (US); Tingbin Yang, Akron, OH (US)

(72) Inventors: Xiong Gong, Hudson, OH (US); Tingbin Yang, Akron, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 14/354,272

(22) PCT Filed: Oct. 29, 2012

(86) PCT No.: PCT/US2012/062394
§ 371 (c)(1),
(2) Date: Apr. 25, 2014

(87) PCT Pub. No.: WO2013/063562
PCT Pub. Date: May 2, 2013

(65) Prior Publication Data
US 2014/0295604 A1    Oct. 2, 2014

Related U.S. Application Data

(60) Provisional application No. 61/551,958, filed on Oct. 27, 2011.

(51) Int. Cl.
*H01L 21/00* (2006.01)
*H01L 51/00* (2006.01)
*H01L 51/42* (2006.01)
*H01L 51/44* (2006.01)
*H01L 51/56* (2006.01)

(52) U.S. Cl.
CPC ........ *H01L 51/0021* (2013.01); *H01L 51/4273* (2013.01); *H01L 51/441* (2013.01); *H01L 51/56* (2013.01); *H01L 51/0036* (2013.01); *H01L 51/0043* (2013.01); *H01L 2251/308* (2013.01); *Y02E 10/549* (2013.01)

(58) Field of Classification Search
CPC ..................... H01L 51/425322; H01L 51/308; H01L 51/0558; H01L 51/4273; H01L 51/441; H01L 51/56
USPC ......... 438/46, 47, 93, 94, 172, 191, 235, 312, 438/582, 648, 656, 685, 785, FOR. 352
See application file for complete search history.

(56) References Cited

U.S. PATENT DOCUMENTS

| | | | |
|---|---|---|---|
| 2009/0188558 A1* | 7/2009 | Jen et al. ..................... | 136/256 |
| 2013/0240027 A1* | 9/2013 | Zakhidov et al. ............ | 136/255 |
| 2014/0163188 A1* | 6/2014 | Osaka ................ | H01L 51/0036 526/240 |

* cited by examiner

Primary Examiner — Kyoung Lee
Assistant Examiner — Joannie A Garcia
(74) Attorney, Agent, or Firm — Renner, Kenner, Greive, Bobak, Taylor & Weber

(57) ABSTRACT

An improvement in a method of making a semiconducting device having a hole-collecting electrode includes coating the hole-collecting electrode with a p-type transition metal oxide through a sol-gel process.

16 Claims, 9 Drawing Sheets

P-TYPE TRANSITION METAL OXIDE-BASED FILMS SERVING AS HOLE TRANSPORT LAYERS IN ORGANIC OPTOELECTRONIC DEVICES

CROSS-REFERENCE TO RELATED APPLICATIONS

The present application claims the benefit of U.S. Provisional Patent Application No. 61/551,958, filed Oct. 27, 2011.

FIELD OF THE INVENTION

The present invention generally relates to hole transport layers for semiconducting devices. More particularly, the present invention relates to sol-gel methods of deposition of hole transport layers on an electrode of such devices.

BACKGROUND OF THE INVENTION

Bulk heterojuction (BHJ) polymer solar cells (PSCs) based on conjugated polymers (electron donor (D)) blended with fullerene derivatives (electron acceptors (A)) have attracted great attention due to their potential as renewable energy sources, and the advantages of easy processing and the possibility to fabricate inexpensive, light weight flexible devices. Power conversion efficiency (PCE) of over 8% have been reported for BHJ PSCs under AM1.5G with an illuminating intensity of 100 mW/cm$^2$. However, the major challenge for BHJ PSCs is the demonstration of long-term air stability.

BHJ PSCs are typically fabricated with a transparent conductive anode (e.g. indium tin oxide (ITO)), a low-work-function metal cathode(e.g. Al, Ba/Al and Ca/Ag (Al)), and an active layer (D:A) sandwiched between the anode and the cathode. The cathode is inherently flawed in lower long-term stability. Poly(3,4-ethylenedioxythiophene):poly(styrene sulfonate) (PEDOT:PSS) is often used to smooth the surface of anode, ITO. However, it has been demonstrated that long-term stability is a problem because PEDOT:PSS is hygroscopic and acidic in nature. PEDOT:PSS will etch the ITO, in particular, at ambient condition and accelerate indium diffusing into photoactive layer, then induce a fast degradation of active layer.

Two approaches have been developed to circumvent these problems. One is to develop BHJ PSCs with an inverted device structure. Another is to introduce a stable buffer layer to replace the PEDOT:PSS. Recently, metal oxides, such as molybdenum oxide (MoO$_3$), vanadium pentoxide (V$_2$O$_5$) are thermally deposited onto the ITO anode as a hole transport layer. The elimination of the PEDOT:PSS layer improves the device stability.

Notably, thermal deposition requires the use of complex and expensive equipment, including vacuum chambers and high temperatures, for deposition of the metal oxide on the substrate. High temperature and thus high energy is required to vaporize the solid metal sample. Thus, there is a need in the art for a sol-gel method for thin film deposition of MoO$_3$ in BHJ PSCs. This need extends more generally to sol-gel thin film deposition of hole transport layers of other p-type metal oxides in other semiconductor devices.

SUMMARY OF THE INVENTION

In a first embodiment, this invention provides an improvement in a method of making a semiconducting device having a hole-collecting electrode, the improvement comprising: coating the hole-collecting electrode with a p-type transition metal oxide through a sol-gel process.

In a second embodiment, this invention provides a method as in the first embodiment, wherein the p-type transition metal oxide is selected from MoO$_3$, V$_2$O$_5$, NiO, and WO$_3$.

In a third embodiment, this invention provides a method as in the first or second embodiments, wherein the semiconducting device is an organic optoelectronic device.

In a fourth embodiment, this invention provides a method as in any of the first through third embodiments, wherein the organic optoelectronic device is selected from photovoltaic cells, light emitting diodes, and photodetectors.

In a fifth embodiment, this invention provides a method as in any of the first through fourth embodiments, wherein the organic optoelectronic device is bulk heterojunction photovoltaic cell.

In a sixth embodiment, this invention provides a method as in any of the first through fifth embodiments, wherein the bulk heterojunction photovoltaic cell includes a heterojunction active layer including a polymer blend of electron donor and electron acceptor material.

In a seventh embodiment, this invention provides a method as in any of the first through sixth embodiments, wherein the electron donor is PBDT-DTNT and the electron acceptor is PC71-BM.

In an eighth embodiment, this invention provides a method as in any of the first through seventh embodiments, wherein the hole-collecting electrode is indium-tin-oxide.

In a ninth embodiment, this invention provides a method as in any of the first through eighth embodiments, wherein the heterojunction photovoltaic cell includes an aluminum electron-collecting electrode.

In a tenth embodiment, this invention provides a method as in any of the first through ninth embodiments, wherein the p-type transition metal oxide is MoO$_3$.

In an eleventh embodiment, this invention provides a method as in any of the first through third embodiments, wherein the wherein the p-type transition metal oxide is MoO$_3$.

In a twelfth embodiment, this invention provides a method for manufacturing a solar cell, the method comprising: providing an anode; providing an active layer including a polymer; providing a cathode; coating the anode with a p-type transition metal oxide thin film derived from sol-gel process.

In a thirteenth embodiment, this invention provides a method as in the twelfth embodiment, wherein the transition metal oxide thin film is selected from MoO$_3$, V$_2$O$_5$, NiO, and WO$_3$.

In a fourteenth embodiment, this invention provides a method as in either of the twelfth or thirteenth embodiments, wherein the transition metal oxide thin film is MoO$_3$.

In a fifteenth embodiment, this invention provides a method as in any of the twelfth through fourteenth embodiments, wherein the anode is indium-tin-oxide, and the active layer is a polymer blend of PBDT-DTNT and PC71-BM.

DETAILED DESCRIPTION OF ILLUSTRATIVE EMBODIMENTS

Figure 1:
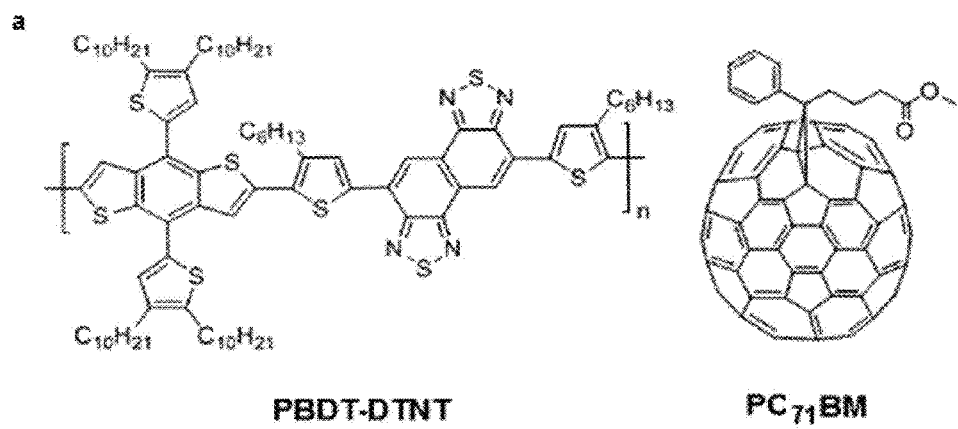
FIG. 1 shows the molecular structures of PBDT-DTNT and PC$_{71}$BM.

The present invention provides a method of depositing hole transport layers on a hole-collecting electrode in a semiconducting device. Herein, a "semiconducting device" includes any device including a semiconducting material and a hole-collecting electrode.

In some embodiments, the semiconducting device is selected from organic optoelectronic devices. In some embodiments, the semiconducting device is an organic optoelectronic device selected from photovoltaic cells, light emitting diodes, and photodetectors. In some embodiments the semiconducting device is a thin film transistor.

In some embodiments, the semiconducting device is a photovoltaic cell selected from single layer photovoltaic cells, bilayer photovoltaic cells and heterojunction photovoltaic cells. In some embodiments, the photovoltaic cell is a heterojunction photovoltaic cell selected from bulk heterojuction photovoltaic cells and graded heterojunction photovoltaic cells.

In some embodiments the semiconducting device is an organic light emitting diode.

In some embodiments, the semiconducting device is a photodetector device selected from active pixel sensors, photodiode light sensors, light dependent resistors, In some embodiments, the semiconducting device is an active pixel sensor selected from charged-coupled device sensors (CCD sensors) and complementary metal-oxide-semiconductor sensors (CMOS sensors).

In some embodiments the semiconducting device is a thin film transistor.

The hole transport layer is a p-type transition metal oxide. In some embodiments the p-type transition metal oxide is selected from MoO₃, V₂O₅, NiO, and WO₃. In some embodiments, the p-type transition metal oxide is molybdenum trioxide (MoO₃). In some embodiments, the p-type metal oxide is tungsten trioxide (WO₃). In some embodiments, the p-type metal oxide is vanadium pentoxide (V₂O₅). In some embodiments, the p-type metal oxide is nickel(II) oxide (NiO).

In this invention, a p-type transition metal oxide film is formed on the hole-collecting electrode of the semiconducting device through a sol-gel process that employs a low annealing temperature. This is beneficial from a manufacturing standpoint, particularly as compared to thermal deposition techniques of the prior art.

To form the p-type metal oxide on the hole-collecting electrode, a colloidal metal-oxide precursor (sol) is first formed. It should be noted that it is possible to obtain the desired metal oxide already prepared, thereafter forming the metal-oxide precursor. However, the metal oxide might be prepared by oxidation of the base metal through known or developed processes. Regardless, an appropriate solvent is employed to create the colloidal precursor, and the colloidal metal-oxide precursor is then deposited as a coating on a semiconducting device and annealed to form the desired film (gel).

In a particular embodiment, the metal-oxide precursor is a molybdenum-oxide precursor. Though the molybdenum trioxide can be obtained from any commercial source, it may also be formed by mixing molybdenum powder with hydrogen peroxide to form molybdenum trioxide (MoO₃) and water:

$$Mo + H_2O_2 = MoO_3 + H_2O$$

The solution may need to be centrifuged to remove residual Mo metal. The solution is then dried to obtain the molybdenum trioxide, which is then dissolved in methanol. This resulting MoO₃ precursor can then be used as a coating on a hole-collecting electrode of a semiconducting device.

Once prepared, the colloidal metal oxide precursor is used to coat the hole-collecting electrode. The colloidal metal oxide precursor can be coated onto the hole-collecting electrode by any suitable method known to those of skill in the art. In particular embodiments the coating is formed through a spin-casting process.

In some embodiments, the colloidal metal-oxide precursor is deposited at a thickness of from 10 nanometers (nm) or greater to 200 nm or less. In other embodiments, the colloidal metal-oxide precursor is deposited at a thickness of from 20 nm or greater to 100 nm or less, in other embodiment, from 25 nm or greater to 50 nm or less, and, in other embodiments, from 25 nm or greater to 35 nm or less. In some embodiments, the colloidal metal-oxide precursor is deposited at a thickness greater than or equal to 10 nm, in other embodiments, 15 nm, in other embodiments, 20 nm, in other embodiments, 25 nm and, in other embodiments, 30 nm. In some embodiments, the colloidal metal-oxide precursor is deposited at a thickness less than or equal to 200 nm, in other embodiments, 150 nm, in other embodiments, 100 nm, in other embodiments, 50 nm and, in other embodiments, 40 nm.

In some embodiments, the colloidal metal-oxide precursor is a colloidal MoO₃ precursor, as above, and is coated onto a hole-collecting electrode of a semi-conducting device. In other embodiments, the colloidal metal-oxide precursor is a colloidal MoO3 precursor, as above, and is coated onto a hole-collecting electrode of a bulk heterojunction photovoltaic cell.

In a particular embodiment, the colloidal metal-oxide precursor is a colloidal MoO₃ precursor, as above, and it is spin cast onto a hole-collecting electrode. In a specific embodiment, a colloidal MoO₃ precursor, as above, is spin cast onto a hole-collecting electrode of a bulk heterojunction photovoltaic cell.

The deposited coating of metal-oxide precursor is thermally annealed to form the desired transition metal oxide film. The annealing creates the desire metal-oxide thin film on the hole-collecting electrode, the metal-oxide film serving as a hole transport layer.

In some embodiments, the colloidal metal-oxide precursor is a colloidal MoO₃ precursor, and the deposited coating is annealed at a temperature of from 225° C. or greater to 300° C. or less. In other embodiments, the annealing temperature is from 225° C. or greater to 275° C. or less. In a particular embodiment, the annealing temperature is 250° C.

In some embodiments, the deposited coating is annealed at a temperature greater than or equal to 225° C., in other embodiments greater than or equal to 250° C. In some embodiments, the deposited coating is annealed at a temperature less than or equal to 300° C., in other embodiments less than or equal to 275.° C.

In some embodiments, the deposited coating is annealed for a period of time of 20 minutes or greater to 60 minutes or less. In other embodiments the deposited coating is annealed for period of time of 25 minutes or more to 35 minutes or less.

Having coated the hole-collecting electrode with the hole-transport layer of metal-oxide, the semiconducting device can be manufactured in accordance with general knowledge in the art. Indeed, the hole-colleting electrode may be coated by the present process at any practical time during the manufacturing process.

In some embodiments, the semiconducting device is a bulk heterojunction photovoltaic cell, and, after the hole-collecting layer is coated with the hole-transport layer, the electron donor/electron acceptor polymer blend of the heterojuction is coated onto the metal-oxide hole transport layer. Thereafter, the heterojunction is annealed, and a final electron-accepting electrode can be deposited on the heterojunction to complete the cell.

In a particular embodiment, the semiconducting device is a bulk heterojunction photovoltaic cell. The heterojunction active layer is a polymer blend of electron donor and electron acceptor material. The electron donor material may be selected from virtually any electron donor material useful in heterojunction photovoltaic cells. The electron acceptor material may be selected from virtually any electron acceptor material useful in heterojunction photovoltaic cells. In a specific embodiment, the polymer blend is PBDT-DTNT and PC71-BM.

The bulk heterojunction photovoltaic cell includes a hole-collecting electrode and an electron-collecting electrode. The hole-collecting electrode may be formed of virtually any hole-collecting electrode material useful in heterojunction photovoltaic cells. The electron collecting electrode may be formed of virtually any electron-collecting electrode material useful in heterojunction photovoltaic cells. In a particular embodiment, the hole-collecting electrode material is ITO. In another embodiment, the electron-collecting electrode material is selected from aluminum magnesium and calcium. In a specific embodiment, the hole-collecting electrode material is ITO and the electron-collecting electrode material is aluminum.

In accordance with this invention, the bulk heterojunction photovoltaic cell layer includes a hole transport layer as taught herein. In a particular embodiment, the hole transport layer is $MoO_3$. The $MoO_3$ layer is coated onto the hole-collecting electrode. The electron donor/electron acceptor polymer blend of the heterojuction is coated onto the metal-oxide hole transport layer. Thereafter, the heterojunction is annealed, and a final electron-accepting electrode is deposited on the heterojunction to complete the cell.

In a specific embodiment, the semiconducting device is a bulk heterojunction photovoltaic cell, The hole-collecting electrode is ITO, the electron-collecting electrode is aluminum, the bulk heterojunction is PBDT-DTNT:PC71BM, and the hole transport layer is $MoO_3$, the precursor being formed and cast and then annealed as described above. Further details are found in the specific examples provided below.

In light of the foregoing, it should be appreciated that the present invention significantly advances the art by providing a method for hole transport layer deposition on a hole-collecting electrode of a semiconducting device.

EXAMPLE

Introduction

Figure 2:
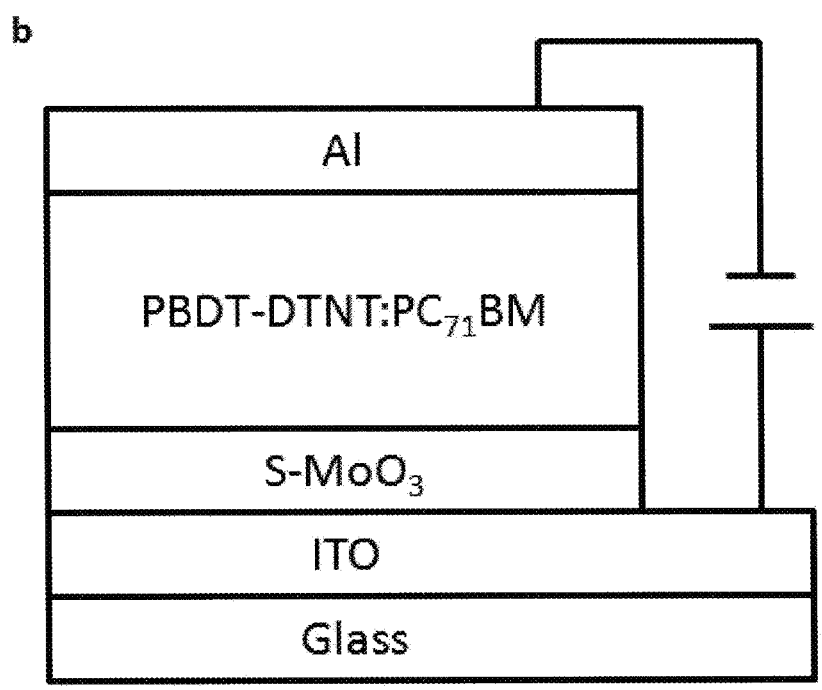
FIG. 2 shows the device structure of a polymer solar cell created per the example section herein.
Figure 3:
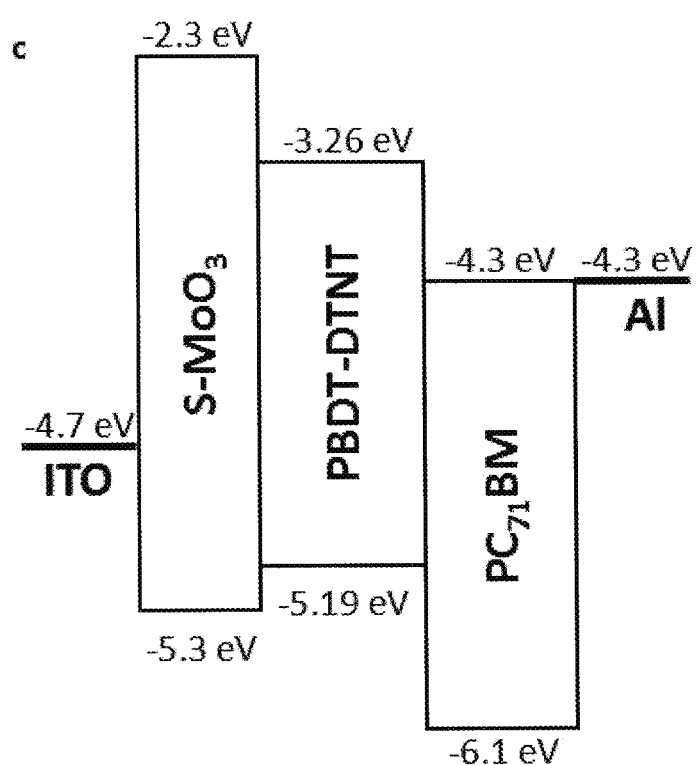
FIG. 3 shows an energy-level diagram showing the LUMO and HOMO of each component of the polymer solar cell of the example section.
Figure 4:
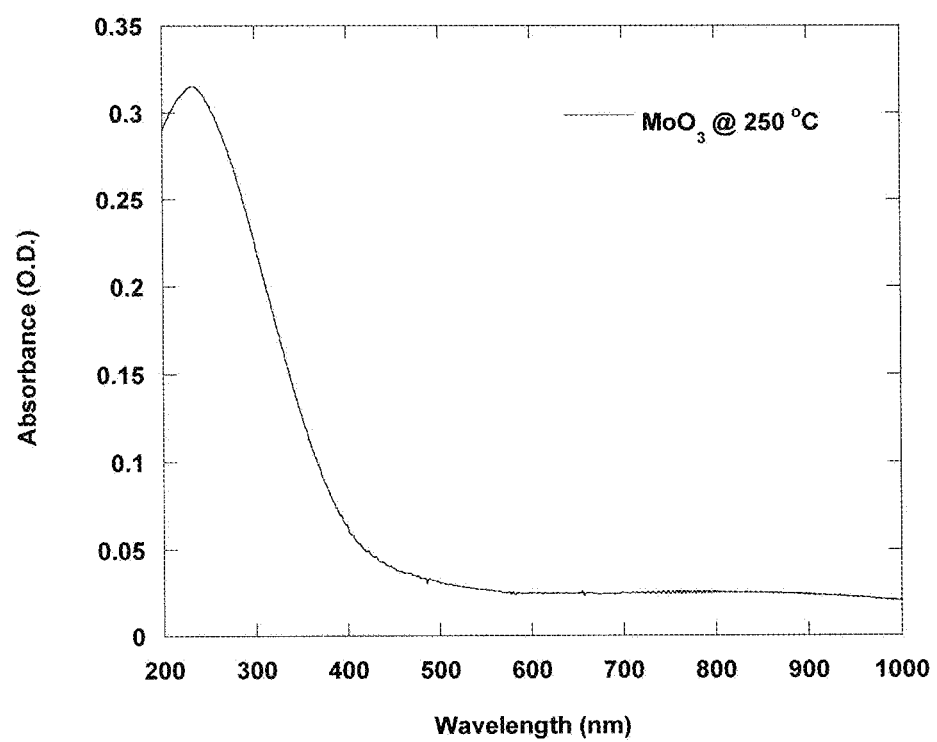
FIG. 4 is a graph showing the absorption spectrum of the solution-processed MoO₃ thin film annealed at 250° C. as per the example section.

The molecular structures of PBDT-DTNT and [6,6]-phenyl $C_{71}$-butyric acid methyl ester ($PC_{71}BM$) are shown in FIG. 1. The bulk heterojunction (BHJ) polymer solar cell (PSC) structure is shown in FIG. 2. The energy levels of the component materials are shown in FIG. 3. Sol-gel derived $MoO_3$ films were prepared using molybdenum in $H_2O_2$ as a precursor solution. The details of synthesis are described in the Experimental Section, below. The precursor solution was cast onto ITO-glass and subsequently treated at different temperatures for 30 minutes. During this time period the precursor was converted to dense $MoO_3$ film by hydrolysis. The UV-visible absorption spectrum of solution-processed $MoO_3$ thin film following thermally annealing at 250° C. for 30 minutes is shown in the graph of FIG. 4. The bandgap of $MoO_3$ film obtained from UV-visible spectrum is ~3.0 eV. It can be seen from FIG. 4 that the $MoO_3$ film is transparent from 400 nm to 1000 nm. This character indicated that $MoO_3$ film can be a buffer layer onto ITO-glass allowing all visible light to pass through both the ITO and $MoO_3$ layer and into the polymer active layer (heterojunction). As shown in FIG. 3, because the highest occupied molecular orbital (HOMO) of $MoO_3$ is close to that of PBDT-DTNT, holes can be efficiently transported to the ITO anode without significant loss in energy. Moreover, because the lowest unoccupied molecular orbital (LUMO) of $MoO_3$ is higher than that of PBDT-DTNT, $MoO_3$ film can be functionalized as electron blocking layer.

Figure 5:
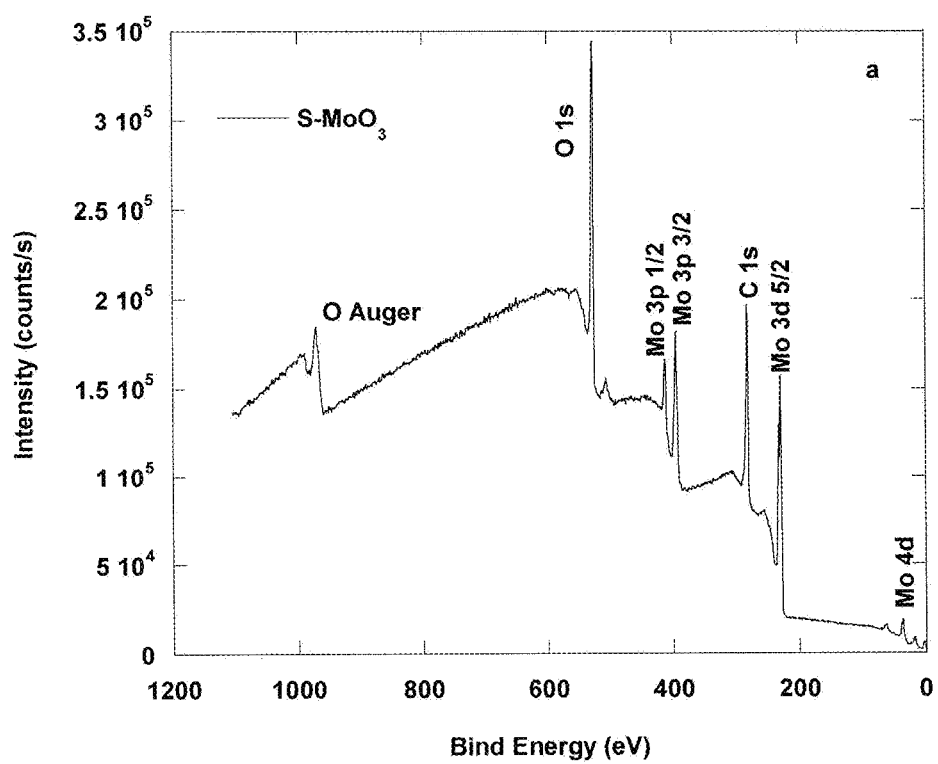
FIG. 5 is a graph showing the x-ray photoelectron spectrum of solution-processed MoO₃ thin film on top of the ITO substrate annealed at 250° C. as per the example section.
Figure 6:
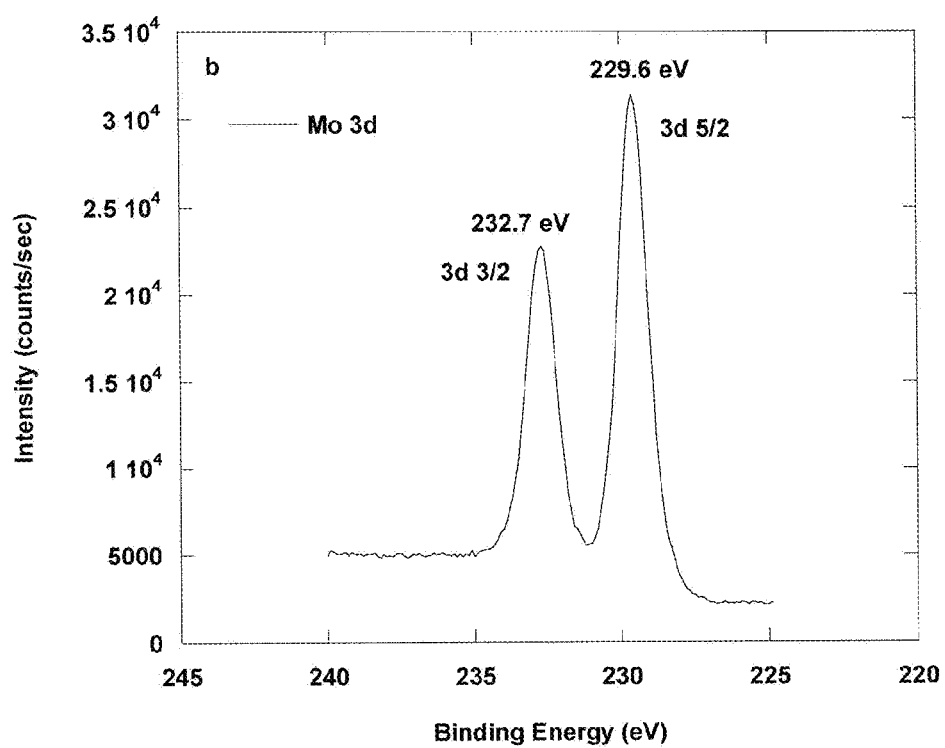
FIG. 6 is a graph showing the core level of Mo 3 d.
Figure 7:
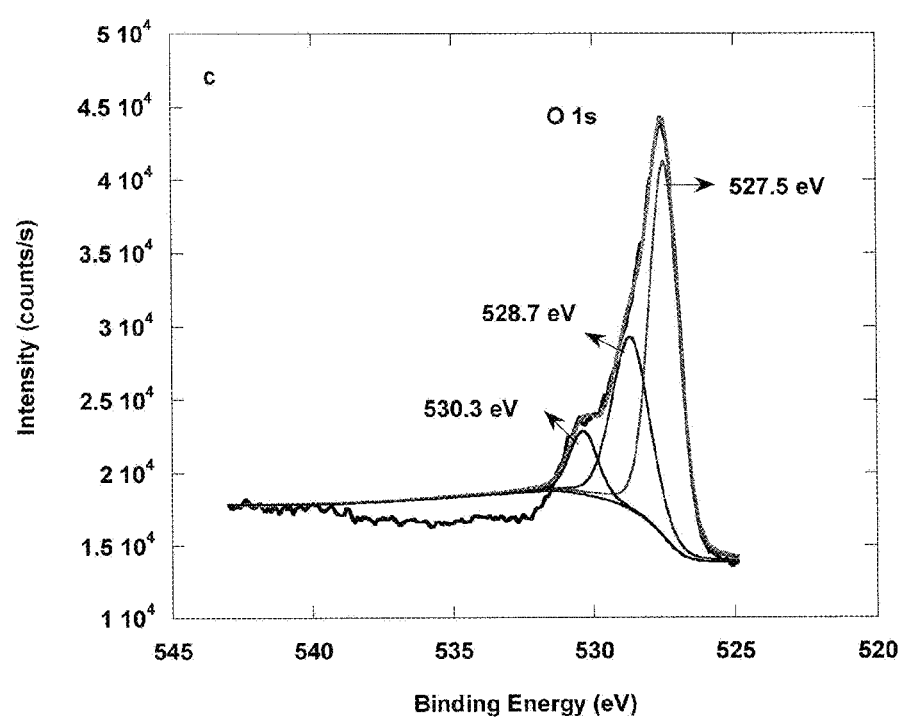
FIG. 7 is a graph showing the core level of O 1 s.

X-ray photoelectron spectroscopy (XPS) measurements were made n order to characterize the composition of sol-gel derived $MoO_3$ film. FIGS. 6 and 7 show core level XPS spectra of Mo 3 d and O 1 s for the sol-gel derived $MoO_3$ films annealed at 250° C. XPS spectra are referenced to the residual hydrocarbon contamination at 284.6±0.1 eV. The whole spectrum of $MoO_3$ (FIG. 5) shows five sharp peaks. The C 1 s peak from the experimental data is located at 281.7 eV, which is about 2.9 eV less than the referenced value, indicating that the other peak positions need to be calibrated by adding this offset. Table 1 summarizes the details of the peak offsets. The binding energies for Mo (3d5/2) and Mo (3d3/2) are 232.5 eV and 235.6 eV, respectively. The binding energy of 232.5 eV corresponds to the oxide of Mo (VI). All these data demonstrated the major component in sol-gel derived $MoO_3$ film is $MoO_3$.

TABLE 1

XPS binding energy of Molybdenum compound

| Item | C 1s | O 1s | Mo 3d5/2 | Mo 3d 3/2 | Mo 3p3/2 |
|---|---|---|---|---|---|
| Exp. Data | 281.7 | 527.6 | 229.6 | 232.7 | 395.4 |
| Calibrated | 284.6 | 530.5 | 232.5 | 235.6 | 398.3 |

The tuning position of O 1 s is at 530.5 eV. However, several O 1 s peaks could be fitted from core level of O 1 s spectra which indicated that more than one oxygen species was present in $MoO_3$ film. Moreover, the peak located at 398.3 eV from core level of Mo 3p3/2, is corresponding to state of Mo (VI). All these results further demonstrated that major component of sol-gel derived $MoO_3$ was formed to $MoO_3$.

Figure 8:
FIG. 8 shows TEM images of the solution-processed MoO₃ after annealed at 250° C.
Figure 9:
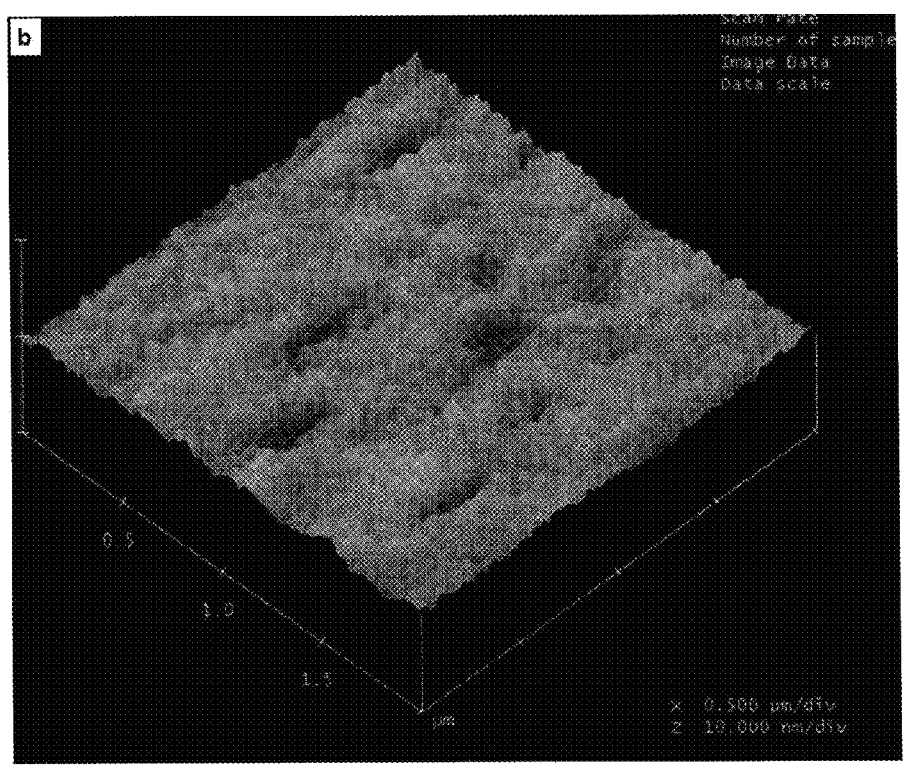
FIG. 9 shows Tapping-Mode AFM images of the solution-processed MoO₃ thin film annealed at 250° C., with a RMS of 0.457 nm.

FIG. 8 shows the transmission electron microscopy (TEM) of the $MoO_3$ thin film annealed at 250° C. It can be seen that the $MoO_3$ thin film is quite uniform. Nanoscale fibrils with a diameter of ~20 nm were observed. No visible pinhole was present in this TEM image. This implied that the thin film was quite dense, preventing current leakage that might occur due to incomplete cover the ITO substrate. An atomic force microscopy (AFM) height image is depicted in FIG. 9, with a root mean roughness (RMS) of 0.475 nm at a scale of 2.0 μm×2.0 μm. This smooth surface of solution-processed MoO$_3$ films offers a good surface to deposit the top photoactive layer. In addition, the typical sharp peak of the ITO substrate was not observed when spin-casting a layer of MoO$_3$, indicating that the rough surface of the ITO had been modified. These results indicated that solution-processed MoO$_3$ has good morphology as a buffer layer in BHJ PSCs.

Figure 10:
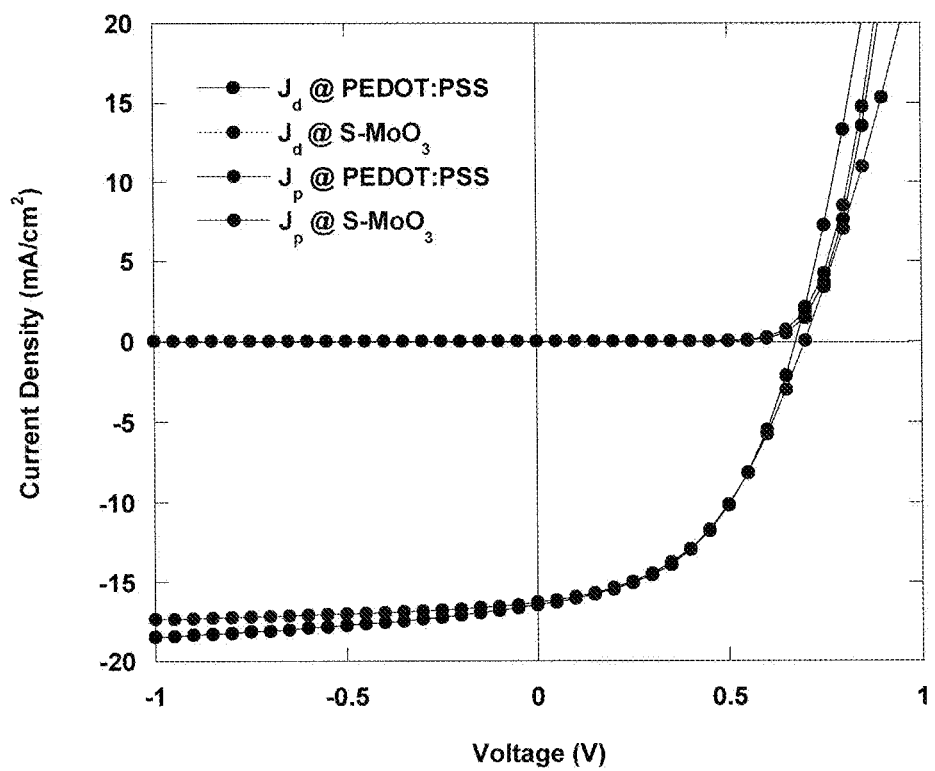
FIG. 10 is a graph showing J-V characteristics of polymer solar cells incorporated with a solution-processed MoO₃ and a PEDOT:PSS layer.

The current-density voltage characteristics (J-V) of the BHJ PSCs incorporated with a sol-gel derived MoO$_3$ is shown in FIG. 10. A PCE of 5.86% was obtained under AM1.5G with light intensity of 100 mW/cm$^2$. BHJ PSCs with sol-gel derived MoO$_3$, the open-circuit voltage ($V_{oc}$) was 0.75 V, short-circuit current density ($J_{sc}$) was 16.44 mA/cm$^2$ and fill factor was 47.5%. Dark J-V characteristics were also plotted in FIG. 10. The rectification at ±1 V was close to 10$^4$, indicating a good diode performance. A high $V_{oc}$ observed from BHJ PSCs with sol-gel derived MoO$_3$ suggested a good band alignment between active layer and electrodes. The small difference in the calculated $V_{oc}$ (0.89V) and observed $V_{oc}$ (0.75 V) implied that only 0.14 V was lost even the electrode contact resistance involved. A high $J_{sc}$ observed from BHJ PSCs with sol-gel derived MoO$_3$ indicated that the charge transport across the MoO$_3$ layer was unhindered. In order to confirm it, BHJ PSCs with PEDOT:PSS as a buffer layer was also investigated. A PCE of 5.89%, a $V_{oc}$ of 0.73 V, a $J_{sc}$ of 16.64 mA/cm$^2$ and a FF of 48.5% were observed. All these device performance parameters are comparable with those observed from BHJ PSCs with sol-gel derived MoO$_3$. Therefore, this example demonstrates that sol-gel derived MoO$_3$ can be used as a hole transporting layer for approaching high performance BHJ PSCs.

In conclusion, sol-gel derived MoO$_3$ as a hole transport layer in bulk heterojunction polymer solar cells was demonstrated. A power conversion efficiency of 5.86% was observed from BHJ PSCs with a device structure of ITO/S-MoO$_3$/PBDT-DTNT:PC$_{71}$BM/Al. This value is comparable with the power conversion efficiency (5.89%) obtained from BHJ PSCs with a device structure of ITO/PEDOT:PSS/PBDT-DTNT:PC$_{71}$BM/Al. Characterization of sol-gel derived MoO$_3$ films was carried out by x-ray photoelectron spectrum, absorption spectrum, transmitted electron microscopy, atomic force microscopy. All these results demonstrated that sol-gel derived MoO$_3$ can be used as a hole transporting layer for approaching high performance BHJ PSCs.

Experimental Section

Materials

PBDT-DTNT was synthesized by Wang et al. recently. PC$_{71}$BM and Molybdenum powder were purchased from Aldrich. Methanol was purchased from Guangzhou Chemical Reagent Factory.

MoO$_3$ Preparation

Molybdenum power (10 g) was first prepared in a clean beaker, then a 100 mL H$_2$O$_2$ (Concentration: 30%) was slowly added into this beaker. To avoid a great deal of heat, a cool water bath was needed. The above solution was centrifuged at a rate of 3000 rpm to remove the rudimental substance. The solution was subsequently dried by distillation. The resulting product was then dissolved in methanol with a concentration of 10 mg/mL for preparation of the MoO$_3$ thin film.

Characterization of MoO$_3$

UV-Visible Absorption Spectrum

The UV-visible absorption spectrum of sol-gel derived MoO$_3$ was measured by a HP 8453 UV-vis spectrophotometer.

X-Ray Photoelectron Spectrum (XPS)

XPS analysis was carried out on an X-ray Photoelectron Spectroscopy/ESCA (Model: Axis Ultra DLD, Kratos Inc.) utilizing a monochromatized Al Kα X-ray source. Spectra are referenced to the residual hydrocarbon contamination at 284.6±0.1 eV. Thin films (~30 nm) were deposited on the ITO substrate for XPS analysis.

Morphologies

Transmission electron microscopy (TEM) experiments were carried out with a Philips Tecnai 12 using an accelerating voltage of 120 kV. Tapping-mode atomic force microscopy (AFM) images were obtained using a NanoScope NS3A system (Digital Instrument) to observe the surface morphology of MoO$_3$.

Device Fabrication

For comparison, the following BHJ PSCs were fabricated: ITO/MoO3/PBDT-DTNT:PC71BM/Al and ITO/PEDOT:PSS/PBDT-DTNT:PC71BM/Al. For each fabrication, the ITO substrate was cleaned by sonication in acetone, detergent, deionized water, and isopropyl alcohol sequentially. In the MoO3 fabrication, the MoO$_3$ thin film was obtained by spin-casting the MoO$_3$ precursor on top of the ITO substrate. The substrate was then subjected to a thermal annealing at 250° C. for 30 min, resulting in an approximately 30 nm thickness of MoO$_3$ thin films. In the PEDOT:PSS fabrication, the PEDOT:PSS layer was spin-cast with a thickness of ~40 nm from aqueous solution (after passing a 0.45 μm filter). The substrate covered PEDOT:PSS was dried for 10 min at 140° C. in air. Both of the substrates were moved into a glove-box for spin-casting the photoactive layer. The 1,2-dichlorbenzene solution comprising PBDT-DTNT (15 mg mL$^{-1}$) plus PC$_{71}$BM (15 mg mL$^{-1}$) was then spin-casting on top of the MoO$_3$ and PEDOT:PSS layer. Subsequently the devices were thermal annealed at 110° C. for 10 min. Finally, the devices were pumped down in vacuum (~3×10$^{-6}$ mba), and a ~100 nm Al film was deposited on top of the photoactive layer.

TABLE 2

| Performance of PSCs under AM1.5G at an intensity of 100 mA/cm$^2$ | | | | |
|---|---|---|---|---|
| Structure | $V_{oc}$ (V) | $J_{sc}$ (mA/cm$^2$) | FF (%) | PCE (%) |
| ITO/MoO$_3$ | 0.75 | 16.44 | 47.5 | 5.86 |
| ITO/PEDOT:PSS | 0.73 | 16.64 | 48.5 | 5.89 |

What is claimed is:

1. In a method of making a semiconducting device having a hole-collecting electrode and an active layer, the improvement comprising:
   coating the hole-collecting electrode with NiO through a sol-gel process, and providing the active layer to include PBDT-DTNT.

2. In the method of claim 1, wherein the semiconducting device is an organic optoelectronic device.

3. In the method of claim 2, wherein the organic optoelectronic device is selected from photovoltaic cells, light emitting diodes, and photodetectors.

4. In the method of claim 3, wherein the organic optoelectronic device is a bulk heterojunction photovoltaic cell.

5. In the method of claim 4, wherein the active layer is a polymer blend of electron donor and electron acceptor material, wherein the electron donor material is the PBDT-DTNT.

6. In the method of claim 5, wherein the electron acceptor material is PC71-BM.

7. In the method of claim 6, wherein the hole-collecting electrode is indium-tin-oxide.

8. In the method of claim 7, wherein the heterojunction photovoltaic cell includes an aluminum electron-collecting electrode.

9. A method for manufacturing a solar cell, the method comprising: providing an anode; providing an active layer including PBDT-DTNT; providing a cathode; coating the anode with a NiO thin film derived from a sol-gel process.

10. The method of claim 9, wherein the anode is indium-tin-oxide, and the active layer is a polymer blend of the PBDT-DTNT and PC71-BM.

11. In a method of making a semiconducting device comprising an optoelectronic device that includes a bulk heterojunction layer that includes a blend of PBDT-DTNT and PC71-BM, the optoelectronic device also having a hole-collecting electrode, the improvement comprising:
  coating the hole-collecting electrode with a p-type transition metal oxide through a sol-gel process.

12. In the method of claim 11, wherein the hole-collecting electrode is indium-tin-oxide.

13. In the method of claim 12, wherein the optoelectronic device includes an aluminum electron-collecting electrode.

14. In the method of claim 11, wherein the p-type transition metal oxide is selected from $MoO_3$, $V_2O_5$, NiO, and $WO_3$.

15. A method for manufacturing a solar cell, the method comprising: providing an anode; providing an active layer formed of a blend of PBDT-DTNT and PC71-BM; providing a cathode; coating the anode with a p-type transition metal oxide thin film derived from a sol-gel process.

16. The method of claim 15, wherein the p-type transition metal oxide thin film is selected from $MoO_3$, $V_2O_5$, NiO, and $WO_3$.

* * * * *